(12) United States Patent
Matsumoto

(10) Patent No.: US 6,994,507 B2
(45) Date of Patent: Feb. 7, 2006

(54) TRANSPORT APPARATUS

(75) Inventor: Ken Matsumoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 10/718,678

(22) Filed: Nov. 24, 2003

(65) Prior Publication Data
US 2004/0168765 A1 Sep. 2, 2004

(30) Foreign Application Priority Data
Nov. 28, 2002 (JP) ............................. 2002-345928

(51) Int. Cl.
B65G 21/677 (2006.01)
G03F 1/00 (2006.01)
G03B 27/52 (2006.01)
G03B 27/62 (2006.01)

(52) U.S. Cl. ........................ 414/217; 355/30; 355/75; 430/5

(58) Field of Classification Search ................ 438/758; 355/30, 75; 414/217; 430/5; 118/715
See application file for complete search history.

(56) References Cited

U.S. PATENT DOCUMENTS

| 5,879,458 | A | 3/1999 | Roberson, Jr. et al. ..... 118/715 |
| 6,042,651 | A | 3/2000 | Roberson, Jr. et al. ..... 118/715 |
| 6,221,163 | B1 | 4/2001 | Roberson, Jr. et al. ..... 118/715 |
| 6,368,411 | B2 | 4/2002 | Roberson, Jr. et al. ..... 118/715 |
| 6,517,304 | B1 | 2/2003 | Matsumoto ................. 414/217 |
| 6,593,034 | B1 | 7/2003 | Shirasaki ...................... 430/5 |
| 6,619,903 | B2 * | 9/2003 | Friedman et al. ....... 414/331.14 |
| 6,788,392 | B2 * | 9/2004 | Nakano ....................... 355/72 |
| 2001/0026355 | A1 * | 10/2001 | Aoki et al. ................... 355/30 |
| 2001/0042439 | A1 | 11/2001 | Roberson, Jr. et al. .......... 95/8 |
| 2002/0020751 | A1 | 2/2002 | Matsumoto ................. 235/487 |
| 2003/0053894 | A1 | 3/2003 | Matsumoto ................. 414/217 |
| 2003/0207182 | A1 | 11/2003 | Shirasaki ...................... 430/5 |

FOREIGN PATENT DOCUMENTS

| JP | 5-114540 | | 5/1993 |
| JP | 05-114540 | * | 5/1993 |
| JP | 11-109606 | | 4/1999 |
| JP | 11-109696 | * | 4/1999 |
| JP | 2001-500669 | | 1/2001 |
| JP | 2001-133960 | | 5/2001 |
| JP | 2001-133961 | | 5/2001 |

OTHER PUBLICATIONS

S. Wolf and R.N. Tauber, Silicon Processing for the VLSI Era, vol. 1, 2$^{nd}$ edition, Lattice Press, 2000, p. 527.*

* cited by examiner

Primary Examiner—Carl Whitehead, Jr.
Assistant Examiner—Heather Doty
(74) Attorney, Agent, or Firm—Fitzpatrick, Cella, Harper & Scinto

(57) ABSTRACT

In transporting a reticle with a pellicle, gas purge is efficiently performed in a pellicle space or the environment in the pellicle space is efficiently maintained. Injectors are provided in a pair of fork positions or a reticle hand. Inert gas is injected and supplied from the injectors into a pellicle space through vent holes of a reticle with a pellicle. In this state, the reticle with the pellicle is transported.

6 Claims, 16 Drawing Sheets

TRANSPORT APPARATUS

FIELD OF THE INVENTION

The present invention relates to the field of a device manufacturing-related apparatus and, more particularly, to the transport of a mask with a pellicle.

BACKGROUND OF THE INVENTION

In an exposure process in the manufacture of devices such as a semiconductor device, a pattern formed on a mask such as a photomask or reticle is projected and transferred onto a substrate such as a wafer coated with a resist to perform pattern formation. At this time, if a foreign matter is present on the mask, the foreign matter is transferred onto the substrate together with the pattern, thereby causing defects. To prevent this, a pattern protective film or pattern protective plate called a pellicle is attached to the mask. Examples of the pellicle can include a membranous substance made of a synthetic resin, a plate-like substance made of, e.g., quartz, and the like. The pellicle is supported by a pellicle support frame at a position offset from the pattern surface of the mask by a predetermined distance. The use of the pellicle causes the foreign matter to attach to a pellicle surface offset from the pattern surface of the mask by the predetermined distance. For this reason, the foreign matter is out of focus on the surface of the substrate and only makes the illuminance of illumination light nonuniform. Consequently, the use of the pellicle reduces an effect of the foreign matter in exposure.

FIG. 1 is a schematic view showing the structure of a mask with a pellicle. A pellicle structure 24 is generally attached to the pattern surface side of a mask 23 through a pellicle support frame 25 with an adhesive or the like. The pellicle structure 24 comprises the pellicle support frame 25 arranged to surround a pattern formed on the mask 23, and a pellicle film (or pellicle plate; in this specification, a pellicle film or pellicle plate is generically called a pellicle) 26 which is attached to one end face of the pellicle support frame 25 and has high transmittance with respect to exposure light. When a space (to be referred to as a pellicle space) enclosed with the pellicle structure 24 and mask 23 is completely sealed, the pellicle 26 may expand or contract. To solve this problem, a vent hole 27 is provided in the pellicle support frame 25 so as to prevent occurrence of a difference in atmospheric pressure between the inside and outside of the pellicle space. A dustproof filter (not shown) is also provided in the vent hole 27 or its entrance or exit to prevent a foreign matter from entering the pellicle space from the vent hole 27.

A manufacturing process of a semiconductor device formed with an ultramicropattern such as an LSI or VLSI employs a reduction projection exposure apparatus which prints by reduction projection a circuit pattern formed on a photomask onto a wafer coated with a resist. Along with an increase in packing density of semiconductor elements, demands for further micropatterning of a circuit pattern have arisen. As a resist process develops, further miniaturization of the exposure line width has been demanded for an exposure apparatus.

To increase the resolving power of the exposure apparatus, there is available a method of decreasing the exposure wavelength and a method of increasing the numerical aperture (NA) of a projection optical system. As for a decrease in the exposure wavelength, the 365-nm i-line has been replaced by a KrF excimer laser with an oscillation wavelength around 248 nm and has further been replaced by an ArF excimer laser with an oscillation wavelength of around 193 nm. A fluorine ($F_2$) excimer laser with an oscillation wavelength around 157 nm is also under development as the next-generation light source.

Far ultraviolet rays, particularly, an ArF excimer laser with a wavelength around 193 nm, and a fluorine ($F_2$) excimer laser with an oscillation wavelength around 157 nm are known to have a plurality of oxygen ($O_2$) absorption bands around their wavelength bands.

For example, fluorine excimer laser light has been applied to an exposure apparatus because of a short wavelength of 157 nm. The 157-nm wavelength falls within a wavelength region generally called a vacuum ultraviolet region. In this wavelength region, light is greatly absorbed by oxygen molecules, and hardly passes through the air. The fluorine excimer laser can only be applied in an environment in which the atmospheric pressure is decreased to almost vacuum and the oxygen concentration is sufficiently decreased.

Oxygen absorbs light to generate ozone ($O_3$), and the ozone promotes absorption of light, greatly decreasing the transmittance. In addition, various products generated by ozone are deposited on the surface of an optical element, decreasing the efficiency of the optical system.

To prevent this, a purge mechanism using inert gas such as nitrogen suppresses to a low level of several ppm order or less the oxygen concentration in the optical path of the exposure optical system of a projection exposure apparatus using far ultraviolet rays, particularly, an ArF excimer laser with a wavelength around 193 nm or a fluorine ($F_2$) excimer laser with an oscillation wavelength around 157 nm as a light source. This also applies to moisture, which must be removed to the ppm order or less.

A large quantity of inert gas is required to suppress the oxygen concentration and moisture concentration throughout the entire exposure apparatus to a level of several ppm or less by a purge mechanism using inert gas, thus posing a problem in terms of the apparatus operating cost. Purge must be performed until the oxygen concentration and moisture concentration are reduced to several ppm order or less, particularly, for a portion serving as the optical path of ultraviolet light. On the other hand, the oxygen concentration and moisture concentration are typically assumed to be at about 100 to 1,000 ppm in an area except an exposure optical path, i.e., a reticle or wafer transport area.

A load-lock mechanism is arranged at a coupling portion between the inside and outside of a purge space such as the interior of an exposure apparatus. When a reticle or wafer is to be externally loaded, the interior of the load-lock mechanism is temporarily shielded from outside air. After the impurity in the load-lock mechanism is purged with inert gas, the reticle or wafer is loaded into the exposure apparatus.

FIG. 2 is a schematic view showing an example of a semiconductor exposure apparatus having a fluorine ($F_2$) excimer laser as a light source and a load-lock mechanism. In FIG. 2, reference numeral 1 denotes a reticle stage (mask stage) on which a reticle (mask) bearing a pattern is mounted; and 2, an exposure section including a projection optical system which projects the pattern on the reticle onto a wafer, an illumination optical system for illuminating the reticle with illumination light, and the like. The illumination light is guided from a fluorine ($F_2$) excimer laser light source (not shown) to the exposure section by an optical guide system.

Reference numeral 8 denotes a housing which covers the exposure optical axis around the reticle stage 1 and whose interior is purged with inert gas; 3, an environment chamber which covers the entire exposure apparatus and manages its environment by circulating air controlled to a predetermined temperature and whose internal temperature is kept constant; 4, an air-conditioner which supplies temperature-controlled clean air to the chamber 3 and keeps a predetermined block such as an optical system in an inert gas atmosphere; and 13, a reticle load-lock used to load a reticle into the housing 8.

Reference numeral 100 denotes a reticle transport apparatus for transporting a reticle, which comprises a reticle hand (transport hand) 15 which holds the reticle and a driving mechanism (e.g., a SCARA robot). Reference numeral 18 denotes a reticle stocker which stocks a plurality of reticles in the housing 8; 22, a foreign matter inspection device which measures the size and number of foreign matters such as dust deposited on a reticle surface or pellicle surface; and 20, an SMIF (Standard Mechanical Interface) pod which accommodates one or a plurality of reticles. Reference numeral 200 denotes a reticle transport apparatus which transports a reticle between the SMIF pod 20 and the load-lock 13 and comprises a reticle hand (transport hand) 16 which holds the reticle and a driving mechanism (e.g., a SCARA robot) which drives the reticle hand 16.

A reticle is loaded into the load-lock 13, and the interior of the load-lock 13 is purged with inert gas until the interior reaches an inert gas atmosphere similar to that in the housing 8. After that, the reticle is transported by the reticle hand 15 to the reticle stage 1, reticle stocker 18, or foreign matter inspection device 22.

As described above, an exposure apparatus using ultraviolet rays, particularly, an ArF excimer laser or a fluorine ($F_2$) excimer laser suffers from large absorption of the ArF excimer laser or fluorine ($F_2$) excimer laser of its wavelength by oxygen and moisture. To obtain a sufficient transmittance and stability of ultraviolet rays, the oxygen and moisture concentrations must be reduced and controlled strictly. For this purpose, a load-lock mechanism is arranged at a coupling portion between the inside and outside of the exposure apparatus. When a reticle or wafer is to be externally loaded into the exposure apparatus, the load-lock mechanism is temporarily shielded from outside air. After the impurity in the load-lock mechanism is purged with inert gas, the reticle or wafer is loaded into the exposure apparatus.

To ensure the transmittance and stability of the fluorine ($F_2$) excimer laser, the entire reticle stage (wafer stage) including the end face of a projection lens and a measurement interference optical system is housed in an airtight chamber, and the interior of the chamber is purged with high-purity inert gas. In addition, the load-lock chamber is disposed adjacent to the airtight chamber in order to load/unload a wafer or reticle into/from the airtight chamber while maintaining a constant internal inert gas concentration. A reticle loaded into the load-lock chamber bears a pellicle, and a pellicle space can communicate with outside air only through a relatively small vent hole. This structure prolongs a time required to complete purge in the pellicle space even after the interior of the load-lock chamber reaches a predetermined inert gas concentration, degrading the productivity. Also, when a valve or dustproof filter is arranged in a path including a vent hole, the ventilation resistance increases, and the purge time is further prolonged.

To increase the gas purge efficiency in a pellicle space, there is proposed a method of actively purging a pellicle with gas in, e.g., Japanese Patent Laid-Open Nos. 2001-133960 and 2001-133961. A gas purge station which actively purges the pellicle space with gas is preferably provided in at least one place such as the load-lock 13, reticle stocker 18, or the like, shown in FIG. 2.

Assume that a vent hole is formed in a pellicle support frame, and a pellicle space is temporarily filled and sealed with inert gas of ppm order. If the oxygen concentration in a space where a reticle with a pellicle is set while being transported into a reticle stocker or while being stocked in the reticle stocker after exposure is higher than that in the pellicle space, oxygen enters the pellicle space through a vent hole. Thus, it is very difficult to maintain the oxygen concentration in the ppm order. If the reticle with the pellicle is temporarily transported outside a load-lock and is reloaded into the load-lock, the oxygen concentration of the atmosphere in the pellicle space becomes a % order, and a long time is required to purge the pellicle space again.

If a vent hole is completely sealed (e.g., if the vent hole formed in advance in a pellicle support frame is sealed after injecting inert gas into a pellicle space through the vent hole), the pellicle space forms a completely closed space. Accordingly, a pellicle film may deflect, expand, or contract due to the difference in atmospheric pressure or oxygen concentration between the inside and outside of the pellicle space.

If a pellicle film deflects in an exposure apparatus, a problem may occur. More specifically, the foreign matter inspection device 22 cannot precisely detect any foreign matter.

If a projection exposure apparatus using far ultraviolet rays such as a fluorine ($F_2$) excimer laser employs a pellicle film made of, e.g., a fluorine-based resin which is conventionally used in KrF exposure or ArF exposure, the durability of the pellicle film becomes a problem because its thickness decreases due to photodecomposition of the film material. For this reason, a pellicle made of glass having higher durability and a thickness of about 0.3 mm to 0.8 mm has been proposed instead. If a glass pellicle in an exposure optical path deflects, a problem such as a change in size of a transfer pattern may occur. This may adversely affect the exposure performance.

In Japanese Patent Laid-Open No. 2001-500669, there is proposed a process of purging an SMIF pod with inert gas to control the humidity and contents of oxygen and a particulate matter (foreign matter) to a low level. Although the proposal is intended for a wafer SMIF pod, an SMIF pod which accommodates a reticle is also preferably purged with inert gas. This is because if sulfuric acid, ammonia, or the like, is present on a chromium surface (a circuit pattern is made from chromium) or glass surface of the reticle, it may react with oxygen contained in air due to exposure energy to cause fogging and may pass through a pellicle. In this case, in FIG. 2, a reticle transport area (transport space) between the SMIF pod 20 and the load-lock 13 is not purged with gas, and oxygen enters a pellicle space through a vent hole formed in a pellicle support frame during the transport of the reticle by the reticle hand 16 due to the difference in atmospheric pressure or oxygen concentration between the inside and outside of the pellicle space. This changes the oxygen concentration in the pellicle space to the % order. Under these circumstances, the pellicle space needs to be purged again, and thus a long purge time is required, which is inefficient.

SUMMARY OF THE INVENTION

The present invention has been made in consideration of the above-mentioned background, and has as its object to efficiently purge a pellicle space with gas or efficiently maintain the environment in the pellicle space in transporting a master with a pellicle.

According to the first aspect of the present invention, there is provided a transport apparatus which has a transport hand and holds and transports a mask with a pellicle by the transport hand, the transport hand comprising a gas injector arranged to inject a gas to at least a portion of a periphery of a pellicle support frame of the mask with the pellicle.

Alternatively, preferably, the mask with the pellicle has, e.g., a vent hole which brings an external space and a pellicle space between a pellicle film or plate and the mask into communication with each other, and the gas injector injects a gas so as to supply the gas into the pellicle space through the vent hole. The gas injector is preferably arranged to inject the gas toward the vent hole.

According to a preferred embodiment of the present invention, the transport hand of the transport apparatus preferably further comprises a gas sucking section. The gas sucking section can be arranged to suck at least part of a gas which is injected from the gas injector and is supplied into the master with the pellicle.

Alternatively, preferably, the mask with the pellicle has, e.g., a first vent hole and a second vent hole which bring an external space and a pellicle space between a pellicle film or plate and the mask into communication with each other, the transport hand further comprises a gas sucking section, the gas injector is arranged to supply a gas into the pellicle space through the first vent hole, and the gas sucking section is arranged to suck the gas in the pellicle space through the second vent hole.

According to a preferred embodiment of the present invention, preferably, the gas injector has a first closing section which closes the first vent hole and is arranged to supply the gas into the pellicle space through the first vent hole while closing the first vent hole by the first closing section, and the gas sucking section has a second closing section which closes the second vent hole and is arranged to suck the gas in the pellicle space through the second vent hole while closing the second vent hole by the second closing section.

According to a preferred embodiment of the present invention, the transport hand of the transport apparatus preferably further comprises a cover with which a periphery of a pellicle structure of the mask with the pellicle is covered while holding the mask with the pellicle.

Preferably, the above-mentioned gas is preferably an inert gas, and more preferably, at least one of nitrogen, helium, and argon.

According to a preferred embodiment of the present invention, the transport apparatus can be arranged to transport the mask with the pellicle at least between a first chamber and a second chamber. The transport apparatus can be arranged in a transport space whose oxygen concentration and/or moisture concentration is higher than an oxygen concentration and/or a moisture concentration of each of the first and second chambers. In transport procedures for inserting the transport hand into the first chamber to make the transport hand hold the mask with the pellicle in the first chamber, and making the transport hand transport the mask with the pellicle through the transport space into the second chamber, a gas is preferably injected from the gas injector before inserting the transport hand into the first chamber. Alternatively, according to another aspect, in transport procedures for inserting the transport hand into the first chamber to make the transport hand hold the mask with the pellicle in the first chamber, and making the transport hand transport the mask with the pellicle through the transport space into the second chamber, a gas is preferably injected from the gas injector after inserting the transport hand into the first chamber and making the transport hand hold the mask with the pellicle in the first chamber.

According to the second aspect of the present invention, there is provided a transport apparatus which transports a mask with a pellicle having a vent hole which brings an external space and a pellicle space between a pellicle film or plate and the mask into communication with each other while holding the mask with the pellicle by a transport hand, the apparatus comprising a closing mechanism which closes the vent hole while holding the mask with the pellicle by the transport hand.

A transport apparatus according to the first and second aspects of the present invention can be incorporated in a device manufacturing apparatus. This device manufacturing apparatus comprises, e.g., an exposure section which transfers a pattern onto a substrate using a mask with a pellicle which is transported by the transport apparatus and can be arranged as an exposure apparatus.

According to the third aspect of the present invention, there is provided a transport method of transporting a mask with a pellicle having a vent hole which brings an external space and a pellicle space between a pellicle film or plate and the mask into communication with each other, the method comprising a step of transporting the mask with the pellicle while purging the pellicle space with an inert gas using the vent hole.

According to the fourth aspect of the present invention, there is provided a transport method of transporting a mask with a pellicle having a first vent hole and a second vent hole which bring an external space and a pellicle space between a pellicle film or plate and the mask into communication with each other, the method comprising a step of supplying an inert gas into the pellicle space through the first vent hole, and transporting the mask with the pellicle while sucking the inert gas from the pellicle space through the second vent hole.

According to the fifth aspect of the present invention, there is provided a transport method of transporting a mask with a pellicle having a vent hole which brings an external space and a pellicle space between a pellicle film or plate and the mask into communication with each other, the method comprising a step of closing the vent hole, and a step of transporting the mask with the pellicle while closing the vent hole.

According to the sixth aspect of the present invention, there is provided a device manufacturing method comprising a step of transferring a pattern onto a substrate coated with a photosensitive agent using the above-mentioned device manufacturing apparatus, and a step of developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings. Note that the arrangement shown in FIG. 2, which has already been described, and its description will apply as an application example of the present invention.

[First Embodiment]

Figure 3:
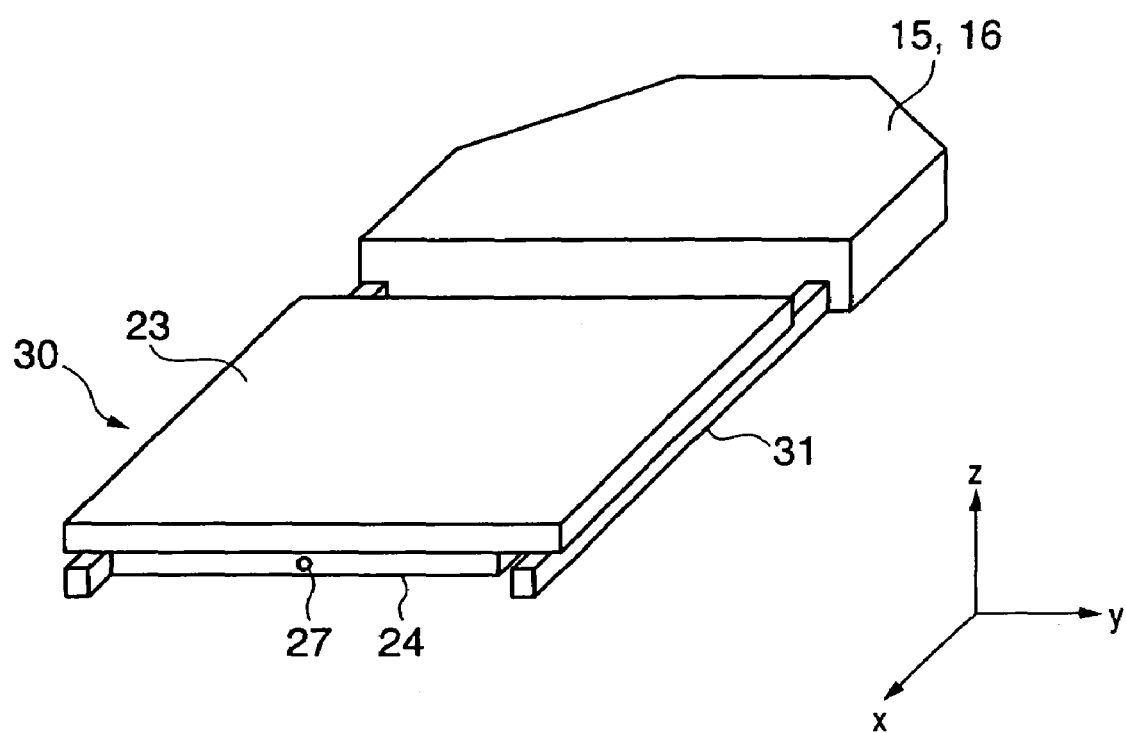
FIG. 3 is a perspective view schematically showing a reticle hand which is holding a reticle with a pellicle.

FIG. 3 is an external view schematically showing a reticle hand (transport hand) according to a preferred embodiment of the present invention. A reticle with a pellicle (a mask with a pellicle) is transported in a transport space between predetermined transfer positions while, e.g., being supported at two opposing ends from below by two fork portions 31.

Figure 2:
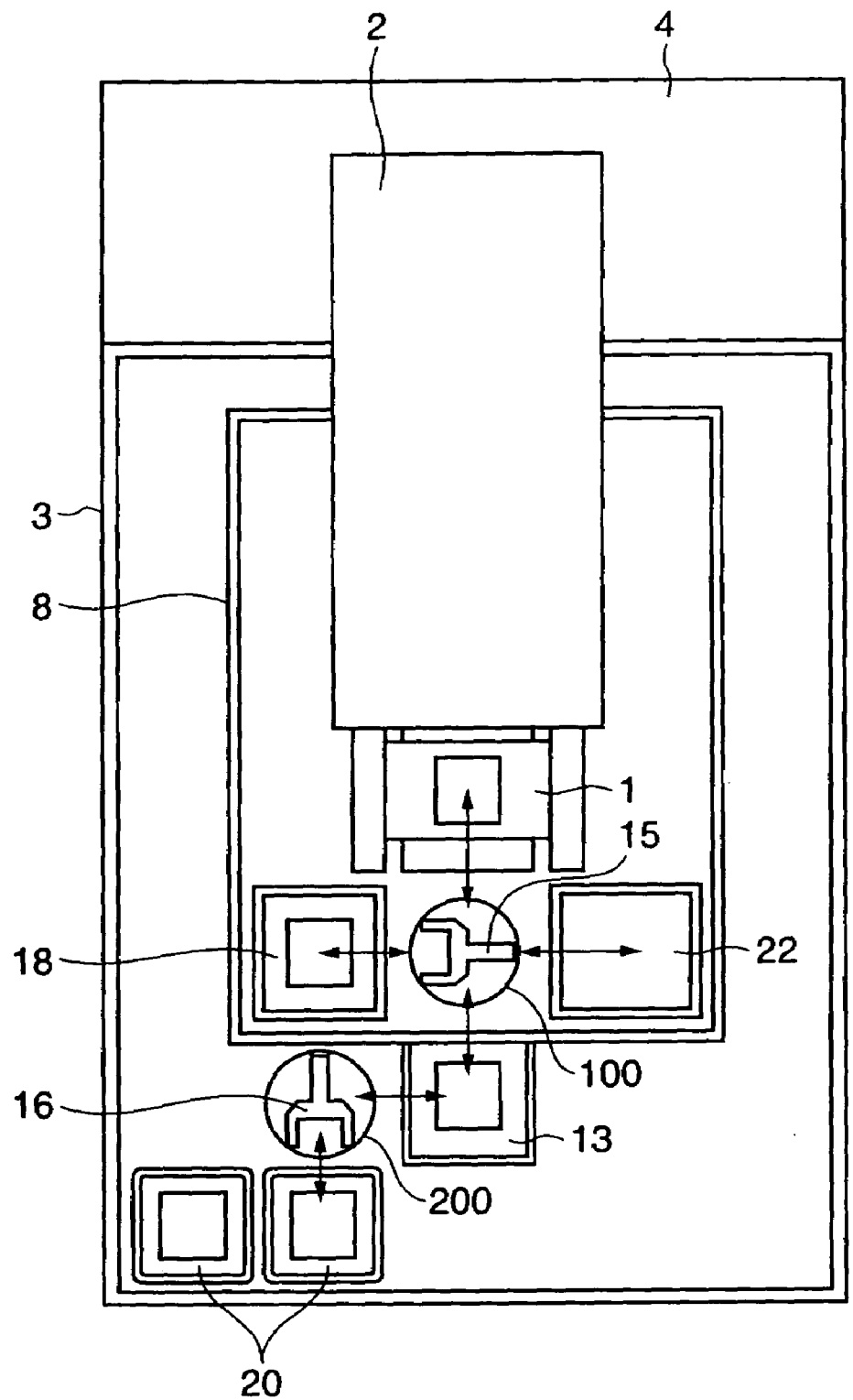
FIG. 2 is a view showing the schematic arrangement of a semiconductor exposure apparatus with the focus on a reticle transport path.

A reticle hand 15 (or 16) shown in FIG. 3 can be adopted as the reticle hand 15 (or 16) shown in FIG. 2. The reticle hand 16 transports a reticle between SMIF pods 20 and a load-lock 13, and the reticle hand 15 transports a reticle between the load-lock 13 and a reticle stocker 18 or between a pellicle inspection device 22 and a reticle stage 1.

The operation area (transport space) of the reticle hand 16 is a space outside an area purged with inert gas, whose temperature and atmospheric pressure are controlled by an environment chamber 3. The operation area (transport space) of the reticle hand 15 is an area purged with inert gas in an environment whose oxygen concentration and moisture concentration are kept at, e.g., about 100 to 1,000 ppm, unlike the interior of an exposure section 2, the load-lock 13, or the reticle stocker 18 in an environment whose oxygen concentration and moisture concentration are kept at about several ppm.

Figure 4:
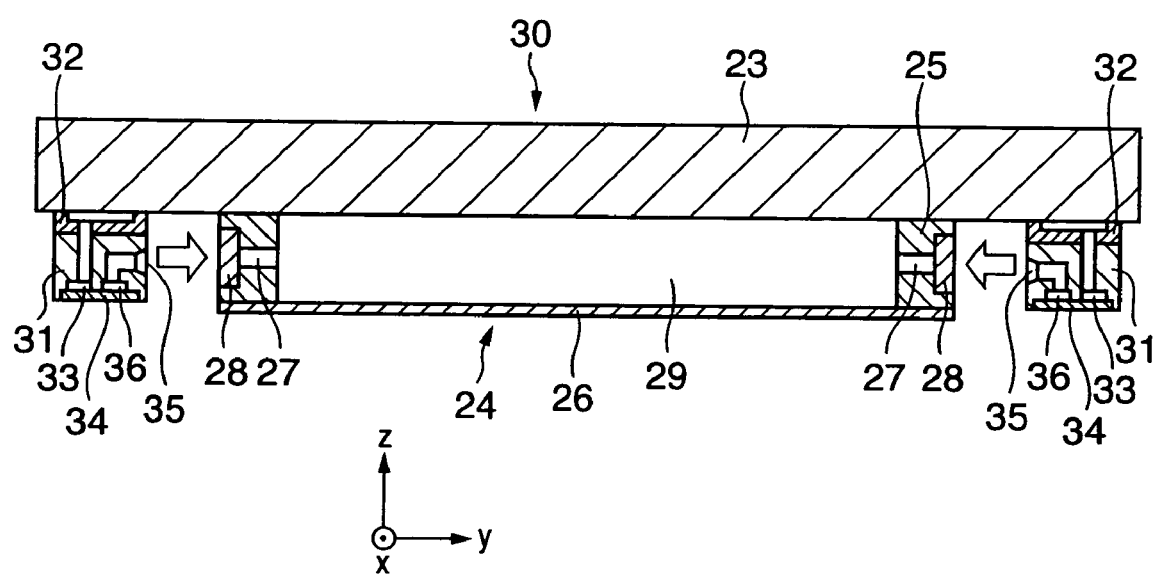
FIG. 4 is a view showing the arrangement of the reticle hand according to the first embodiment of the present invention.
Figure 5:
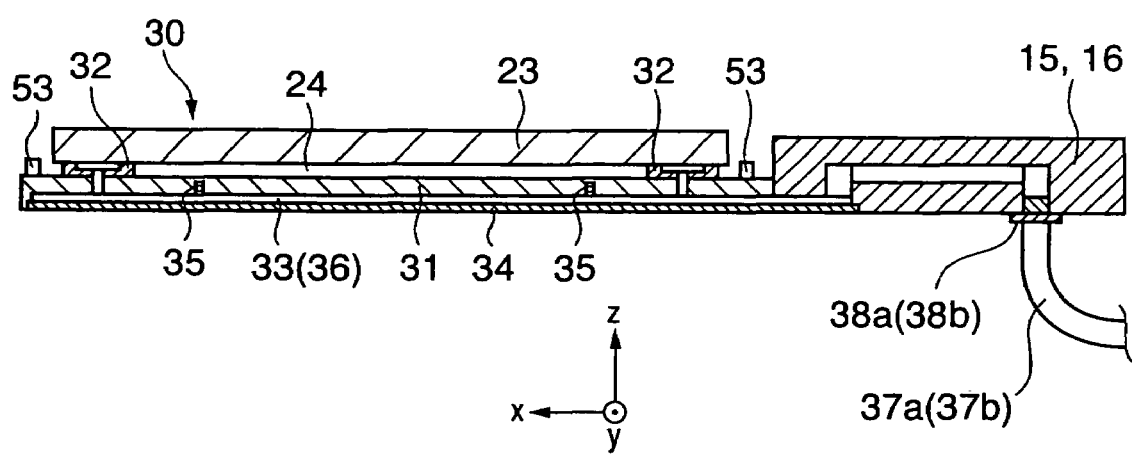
FIG. 5 is a view showing the arrangement of the reticle hand according to the first embodiment of the present invention.

FIG. 4 is a sectional view, taken along the Y-axis, of the reticle hand 15 or 16 shown in FIG. 3, which has a mechanism for supplying inert gas into the pellicle space of a reticle 30 with a pellicle, and FIG. 5 is a sectional view, taken along the X-axis, of the reticle hand 15 or 16.

Each fork portion 31 has chucking pads 32, and the reticle 30 with the pellicle is chucked and held on the fork portions 31 by the chucking pads 32. Chucking holes or grooves formed in the chucking pads 32 are connected to a vacuum source (not shown; e.g., a pump) through suction paths 33 and tubes 37a. Each tube 37a is connected to a coupling portion 38a which is attached to the fork portion 31 and communicates with the suction path 33. In this embodiment, the suction path 33 is formed by covering a groove in the lower surface of the fork portion 31 with a seal member 34.

Figure 1:
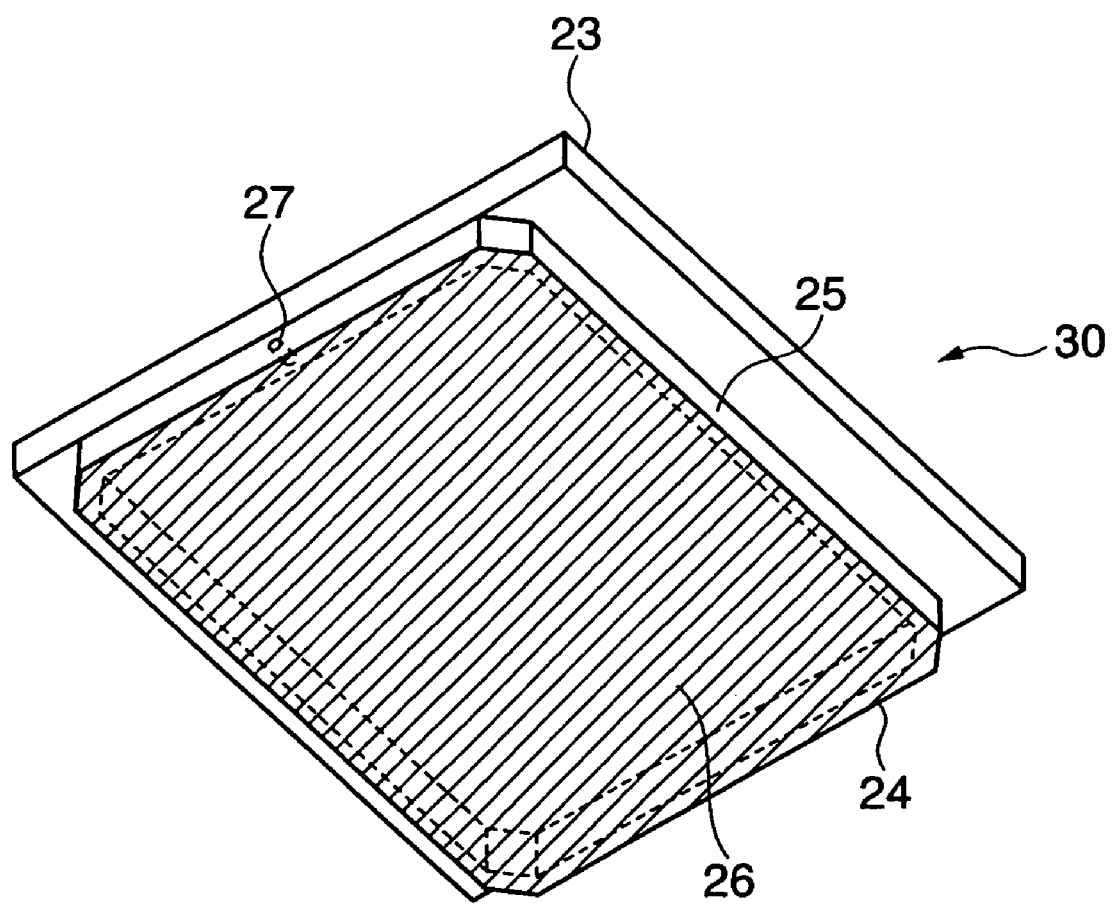
FIG. 1 is a schematic view showing the arrangement of a reticle (mask) with a pellicle.

As has already been described with reference to FIG. 1, a pellicle structure 24 comprises a pellicle film or plate 26 and a pellicle support frame 25. The pellicle structure 24 is attached to a reticle 23 with an adhesive, thereby forming a pellicle space 29. The pellicle support frame 25 comprises one or (preferably) a plurality of vent holes 27 for reducing the difference in atmospheric pressure between the inside and outside of the pellicle space 29 and purging the pellicle space 29 with gas and filters 28 for preventing entrance of a foreign matter into the pellicle space 29.

The pair of fork portions 31 of the reticle hands 15 and 16 each comprises gas injectors 35 which inject inert gas and a gas path 36 for supplying inert gas to the gas injectors 35. In this embodiment, the gas path 36 includes a groove in the lower surface of the fork portion 31 and is formed by covering the groove with the seal member 34, as in the suction path 33. The gas path 36 leads to an inert gas source (not shown) through a tube 37b provided as a system separate from the tube 37a. Each tube 37b is connected to a coupling portion 38b which is attached to the fork portion 31 and communicates with the gas path 36. Note that in FIG. 5, reference numerals 36, 38b, and 37b are parenthesized, which indicate that the gas path 36, coupling portion 38b, and tube 37b are hidden by the suction path 33, coupling portion 38a, and tube 37a, respectively, for illustrative convenience.

As indicated by arrows in FIG. 4, inert gas is injected from the gas injectors 35 toward the vent holes 27 of the reticle 30 with the pellicle. The inert gas to be injected from the gas injectors 35 preferably contains, e.g., at least one of nitrogen, helium, and argon.

During the transport of the reticle 30 with the pellicle, the pressure in the pellicle space 29 is preferably kept at, e.g, a positive pressure of about 1 to 100 Pa with respect to the outside in order to prevent, to the utmost, an influence of the external atmosphere on the pellicle space 29. The pellicle 26 deflects slightly due to the difference in atmospheric pressure between the inside and outside of the pellicle space 29. This deflection, however, poses no problem during the transport. In the foreign matter inspection or exposure of a pellicle surface, when the reticle 30 with the pellicle is transferred to the foreign matter inspection device 22 or reticle stage 1 by the reticle hand 15, the difference in atmospheric pressure between the inside and outside of the pellicle space 29 is eliminated through the vent holes 27 in the pellicle support frame 25.

If the pellicle support frame 25 has the plurality of vent holes 27, each inert gas injector 35 is preferably arranged in the vicinity of each vent hole 27 such that the number of the gas injectors 35 corresponds to that of the vent holes 27.

Figure 6:
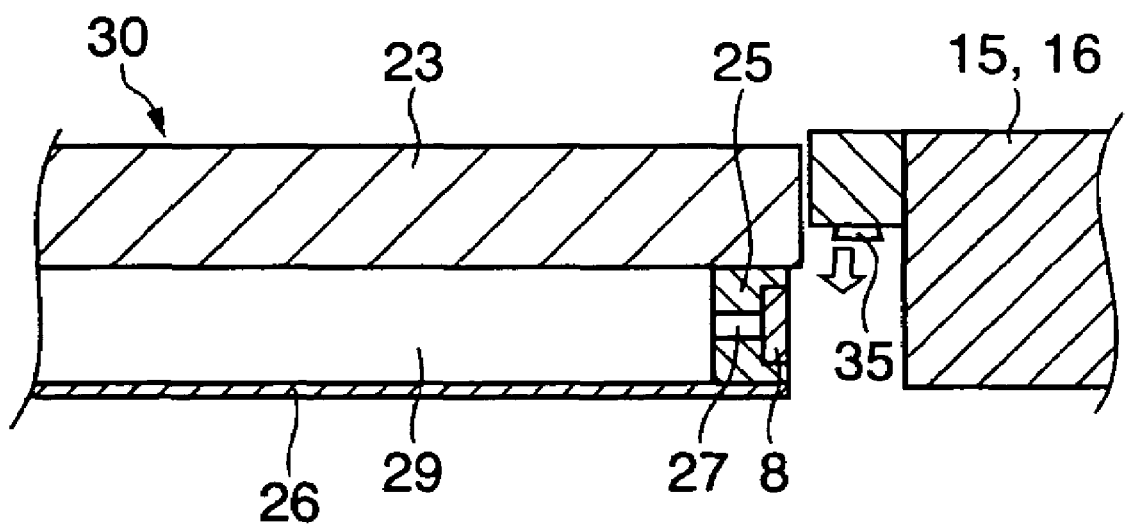
FIG. 6 is a view showing the concept of a modification of the reticle hand according to the first embodiment of the present invention.

A direction in which inert gas is injected from each gas injector 35 need not coincide with the axial direction of the corresponding vent hole 27. The injection direction may tilt with respect to the axial direction, and in extreme cases, it may be perpendicular to the axial direction, as shown in FIG. 6. More specifically, the gas injector 35 may have any arrangement as far as it can supply inert gas into the pellicle space 29 of the reticle 30 with the pellicle.

Inert gas can be injected from the gas injectors 35 at all times. To suppress the amount of inert gas consumed, the gas injectors 35 may inject inert gas only when the reticle 30 with the pellicle is held by the reticle hand 15 or 16 and may stop injecting inert gas during the remaining time.

Figure 16:
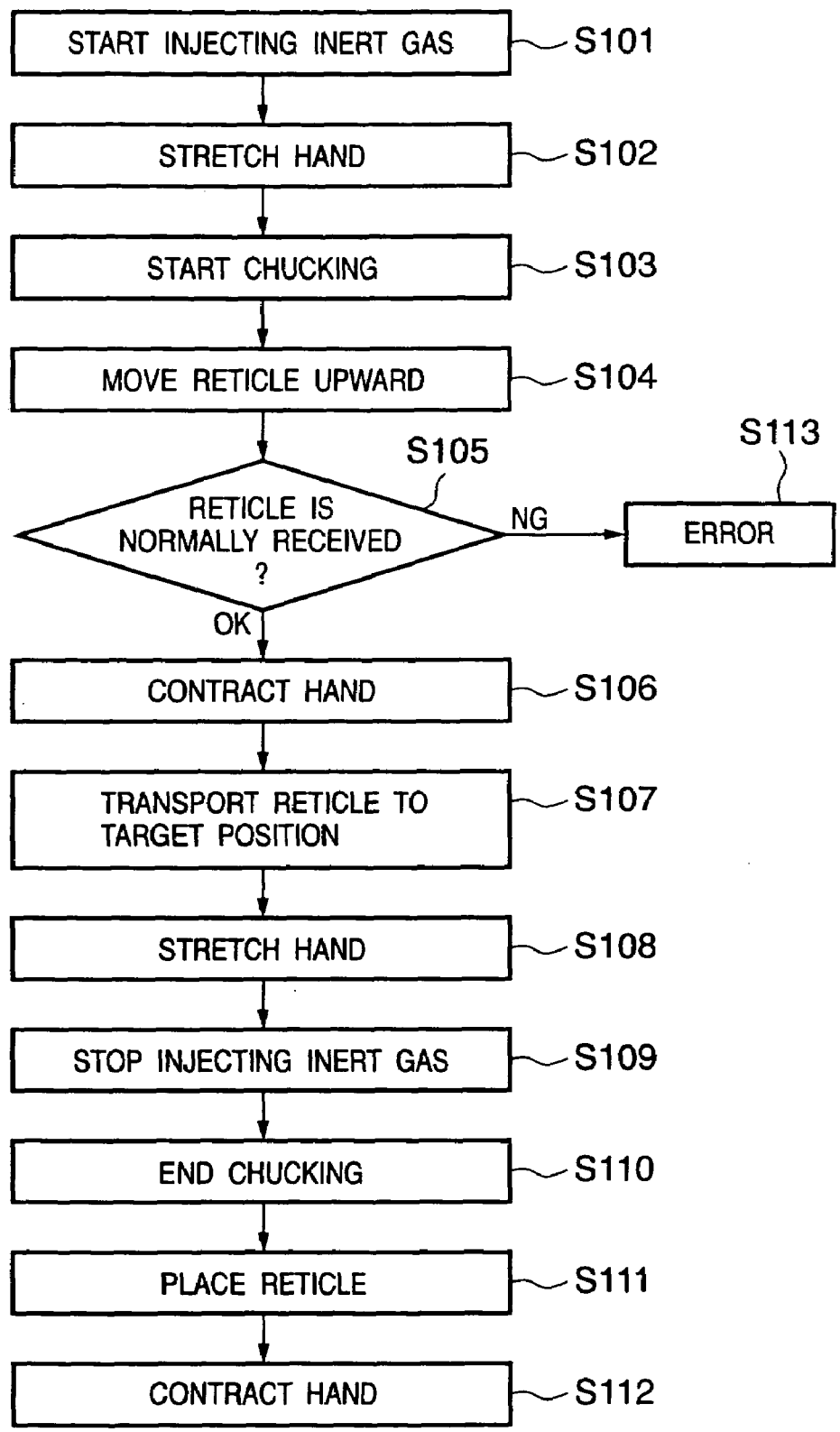
FIG. 16 is a flow chart showing an example of the procedures for transporting a reticle with a pellicle by a reticle hand according to a preferred embodiment of the present invention.

An example of the procedures for transporting a reticle with a pellicle by a reticle hand will be described below with reference to FIG. 16. FIG. 16 is a flow chart showing an example of the procedures for transporting the reticle 30 with the pellicle from the load-lock 13 to the reticle stocker 18 by the reticle hand 15.

Assume in this example that in the initial state, the reticle hand 15 is on standby facing toward the load-lock 13 and is not holding the reticle 30 with the pellicle, and that the gas injectors 35 are stopped from injecting inert gas. As described above, the operation area (transport space) of the reticle hand 15 is in an environment whose oxygen concentration and moisture concentration are typically set at about 100 to 1,000 ppm. Accordingly, the surroundings of the reticle hand 15 are in the same environment.

Under the above-mentioned state, in step S101, the gas injectors 35 of the reticle hand 15 first start injecting inert gas. Then, in step S102, the reticle hand 15 extends into the load-lock 13. Starting injection of inert gas by the gas injectors 35 before the extension of the reticle hand 15 into the load-lock 13 can prevent deterioration of the inert gas environment in the load-lock 13 or pellicle space 29, in which inert gas purge is completed, and the oxygen concentration is set at several ppm or less. The gas injectors 35 can start injecting inert gas, e.g., when the reticle hand 15 is extending or immediately after the reticle hand 15 has extended, or when or after the reticle 30 with the pellicle is chucked.

In step S103, the reticle hand 15 is moved upward by a vertical driving mechanism (not shown) of the transport apparatus 15 until the chucking surfaces of the fork portions 31 come into contact with the lower surface of the reticle 23. The reticle 30 with the pellicle is held on the reticle hand 15, and in this state, the chucking pads 32 start vacuum-chucking the reticle 23.

In step S104, the reticle hand 15 is further moved upward by the vertical driving mechanism, thereby elevating the reticle 30 with the pellicle by the reticle hand 15.

Then, in step S105, it is confirmed whether the reticle 30 with the pellicle is transferred to a normal position of the reticle hand 15. This confirmation can be performed by, e.g., checking whether the reticle 30 with the pellicle is vacuum-chucked by the reticle hand 15. For example, assume that the pressure in a vacuum pipe which comprises the suction path 33, tube 37a, and the like is detected by a sensor (not shown), and that the detected pressure exceeds a predetermined value. The detection reveals that the reticle 30 with the pellicle is not adequately vacuum-chucked, i.e., the reticle 30 with the pellicle is not transferred to the normal position. When this occurs, in step S113, the operator is informed of the occurrence of an error by a warning device (e.g., a rotating lamp, buzzer, display device, or the like).

If the reticle 30 with the pellicle is transferred to the normal position of the reticle hand 15, inert gas which is injected from the gas injectors 35 of the reticle hand 15 is supplied to the pellicle space 29 through the vent holes 27 of the reticle 30 with the pellicle.

If it is determined that the reticle 30 with the pellicle is transferred to the normal position of the reticle hand 15, in step S106, the reticle hand 15 is retracted to unload the reticle 30 with the pellicle from the load-lock 13.

In step S107, the reticle hand 15 transports the reticle 30 with the pellicle to a load position of the reticle stocker 18 serving as a transport target position while supplying inert gas into the pellicle space 29 through the vent holes 27 by the gas injectors 35.

In step S108, the reticle hand 15 is stretched to move the reticle 30 with the pellicle to a predetermined position in the reticle stocker 18.

Then, in step S109, the gas injectors 35 stop from injecting inert gas. The interior of the reticle stocker 18 is typically controlled such that the oxygen concentration and moisture concentration are several ppm or less. For this reason, even if the supply of inert gas to the vent holes 27 is stopped after loading the reticle 30 with the pellicle into the reticle stocker 18, the oxygen concentration in the pellicle space 29 does not increase.

In step S110, the reticle hand 15 stops from vacuum-chucking the reticle 30 with the pellicle. The reticle hand 15 is moved downward by the vertical driving mechanism to place the reticle 30 with the pellicle to the predetermined position (e.g., a shelf) in the reticle stocker 18.

In step S112, the reticle hand 15 is retracted.

As described above, to prevent deterioration of the inert gas environment in the load-lock 13 or pellicle space 29, the gas injectors 35 preferably start injecting inert gas before stretching the reticle hand 15 into the load-lock 13. On the other hand, to minimize the amount of inert gas consumed, the gas injectors 35 preferably start injecting inert gas, e.g., after holding the reticle 30 with the pellicle by the reticle hand 15 and before retracting the reticle hand 15. In this case, since the concentrations of oxygen and water remaining in the vicinity of each gas injector 35 are about 100 to 1,000 ppm, the oxygen concentration and moisture concentration in the pellicle space 29 may increase slightly. By continuously injecting inert gas to the vent holes 27 during the transport of the reticle 30 with the pellicle, the oxygen concentration and moisture concentration in the pellicle space 29 can be decreased during the transport.

As described above, according to the preferred embodiment of the present invention, inert gas is supplied to the vent holes formed in the pellicle support frame or their vicinity while holding the reticle with the pellicle by the reticle hand. With this operation, even if the reticle with the pellicle is transported in the reticle transport area (transport space), whose oxygen concentration and moisture concentration are not sufficiently low, the oxygen concentration and moisture concentration in the pellicle space can be prevented from increasing. For example, even if the oxygen concentration and/or moisture concentration in the pellicle space 29 is not so low as to fall within an allowable range due to insufficient purge in a purge station for purging the pellicle space 29 with inert gas, an improvement in environment in the pellicle space can be expected during the transport of the reticle with the pellicle.

Alternatively, according to the preferred embodiment of the present invention, if the reticle with the pellicle, whose oxygen concentration and moisture concentration in the pellicle space are kept sufficiently low, is to be transported through the reticle transport area (transport space), whose oxygen concentration and moisture concentration are not sufficiently low, the reticle with the pellicle can be transported while keeping a good environment in the pellicle space.

[Second Embodiment]

Differences between the second embodiment of the present invention and the first embodiment will be described below. All matters except those to be mentioned here are subject to the first embodiment.

Figure 7:
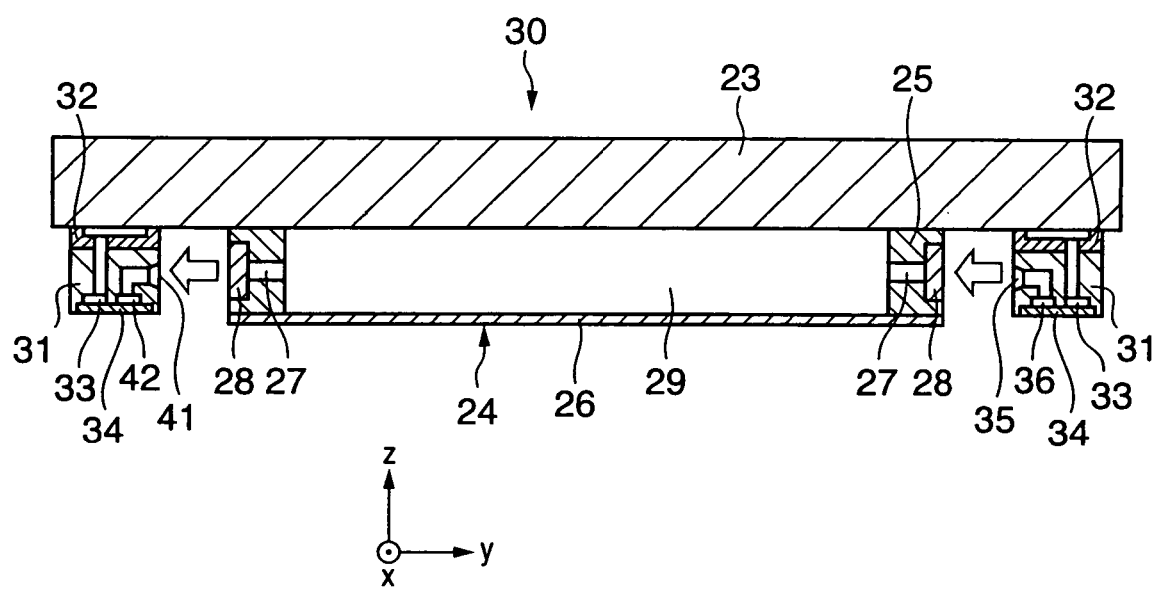
FIG. 7 is a view showing the arrangement of a reticle hand according to the second embodiment of the present invention.

FIG. 7 shows a reticle hand according to the second embodiment of the present invention and is a sectional view, taken along the Y-axis of FIG. 3, of the reticle hand, which has a mechanism for supplying inert gas into the pellicle space of a reticle 30 with a pellicle.

One of two fork portions 31 comprises a gas supply path 36 and gas injectors 35, as in the first embodiment, which supply inert gas to vent holes 27 or their vicinity. The other fork portion 31 comprises a suction path 42 and a sucking section 41, which suck gas in a pellicle space 29 through the vent hole 27.

As described above, according to this embodiment, each reticle hand is arranged to use some (first vent holes) of the plurality of vent holes 27 formed in the reticle 30 with the pellicle to supply gas into the pellicle space 29, and use the remaining ones (second vent holes) to suck the gas from the pellicle space 29. With this arrangement, the pellicle space 29 can efficiently be purged while transporting the reticle 30 with the pellicle. When the pellicle space 29 is purged concurrently with the reticle transport, for example, the purge time in a purge station which can be arranged in a load-lock 13 or reticle stocker 18 can be shortened in consideration of a part purged by the reticle hand. Additionally, even if the reticle with the pellicle passes through a reticle transport area whose oxygen concentration and moisture concentration are low during transport, the oxygen concentration and moisture concentration are unlikely to increase. Thus, the productivity of an exposure apparatus can be increased.

Note that the efficiency increases as the gap between each vent hole 27 and the corresponding inert gas injector 35 or sucking section 41 decreases.

The supply and exhaust of inert gas into and from the pellicle space 29 are preferably performed concurrently in order to prevent a pellicle film to deflect due to fluctuations in atmospheric pressure in the pellicle space 29.

[Third Embodiment]

Differences between the third embodiment of the present invention and the first embodiment will be described below. All matters except those to be mentioned here are subject to the first embodiment.

Figure 8:
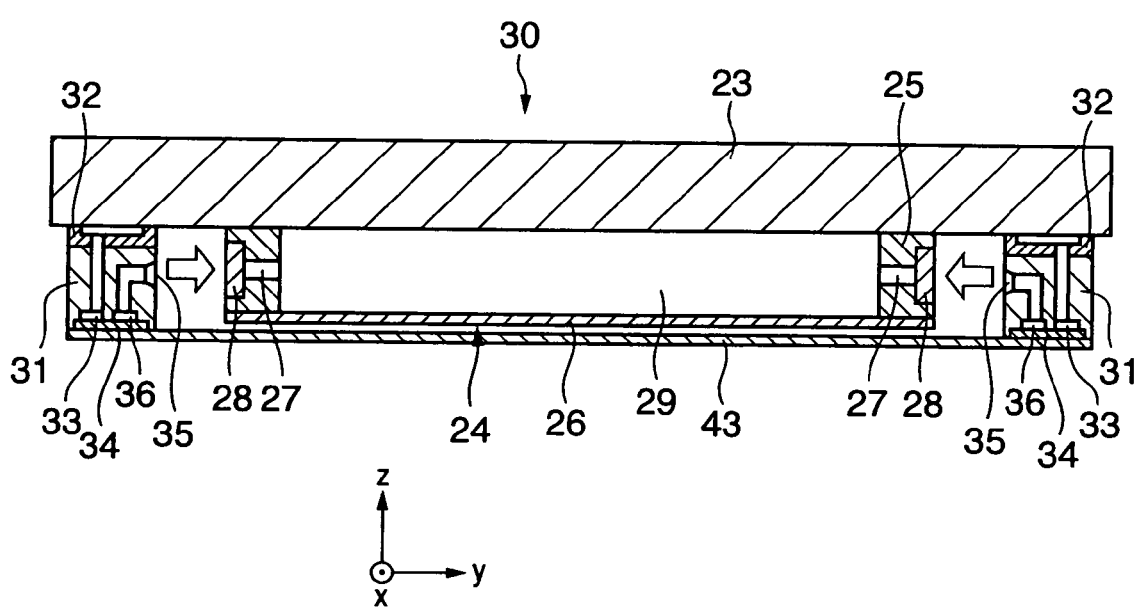
FIG. 8 is a view showing the arrangement of a reticle hand according to the third embodiment of the present invention.
Figure 9:
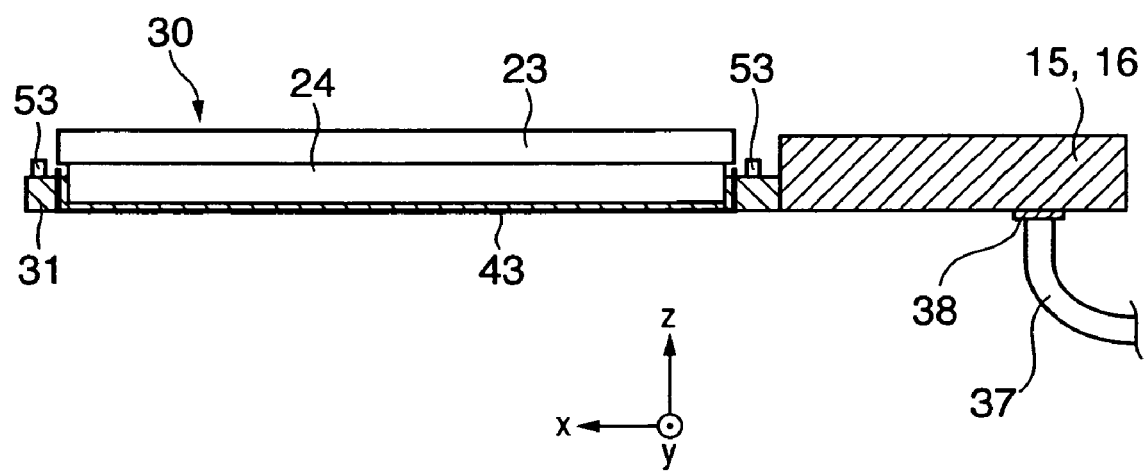
FIG. 9 is a view showing the arrangement of the reticle hand according to the third embodiment of the present invention.
Figure 10:
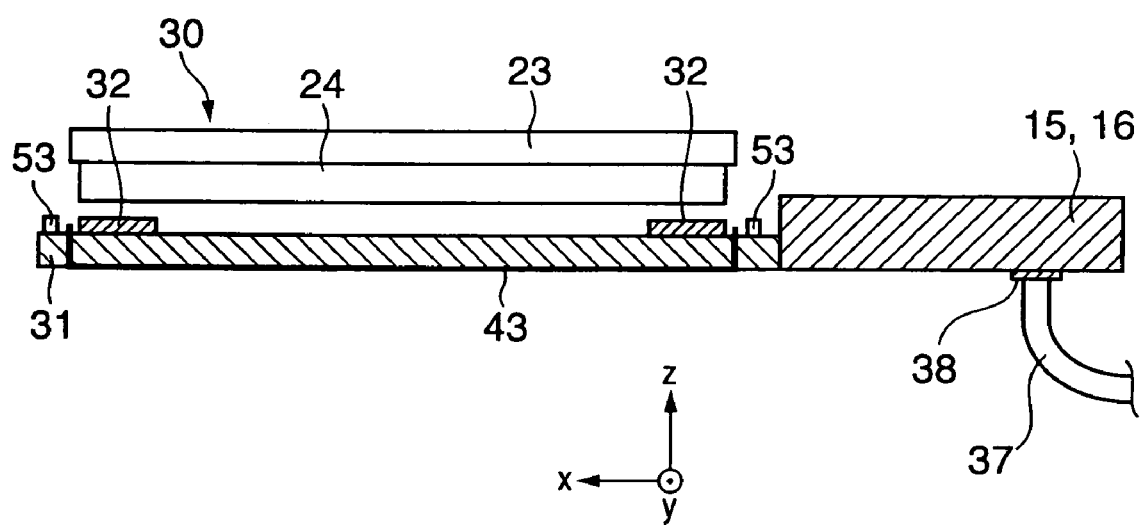
FIG. 10 is a view showing the arrangement of the reticle hand according to the third embodiment of the present invention.

FIGS. 8, 9, and 10 are views showing a reticle hand according to the third embodiment of the present invention. FIG. 8 is a sectional view taken along the Y-axis, and FIGS. 9 and 10 are sectional views taken along the X-axis. FIGS. 8 and 9 show a state in which the reticle with a pellicle is held by the reticle hand, and FIG. 10 shows a state immediately before the reticle hand holds the reticle with the pellicle.

The reticle hand according to this embodiment is formed by adding a pellicle cover 43 to the reticle hand in the first embodiment. The pellicle cover 43 can be attached to, e.g., the lower surfaces of two fork portions 31. While the reticle hand having the pellicle cover 43 holds the reticle with the pellicle, it surrounds a pellicle structure 24. The pellicle cover 43 suppresses exhalation of inert gas from inert gas injectors 35, so that the required supply amount of inert gas can be suppressed, and the purge efficiency increases. Inert gas supplied from the inert gas injectors 35 can be exhausted outside through, e.g., a narrow gap between a reticle 23 and the pellicle cover 43.

When the reticle hand having the pellicle cover 43 is to receive the reticle 30 with the pellicle, the reticle hand is moved horizontally at a level which prevents interference between the pellicle structure 24 and pellicle cover 43, as shown in FIG. 10, and then is moved upward. The above-mentioned embodiment is an example formed by adding a pellicle cover to the first embodiment. This pellicle cover may be added to the second embodiment.

[Fourth Embodiment]

Differences between the fourth embodiment of the present invention and the first embodiment will be described below. All matters except those to be mentioned here are subject to the first embodiment.

Figure 11:
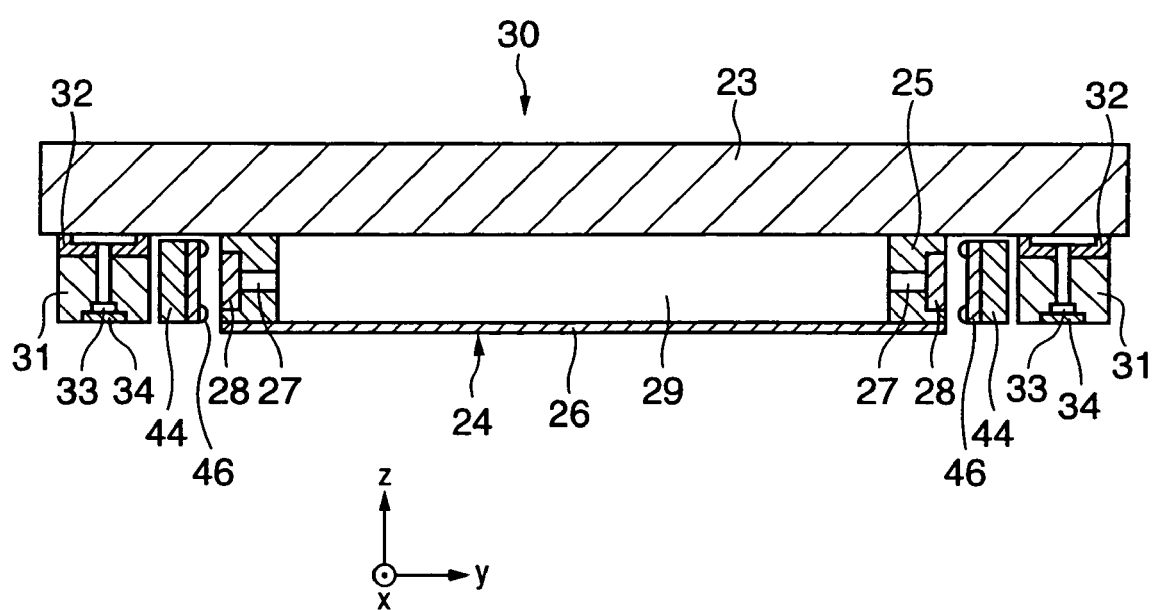
FIG. 11 is a view showing the arrangement of a reticle hand according to the fourth embodiment of the present invention.
Figure 12:
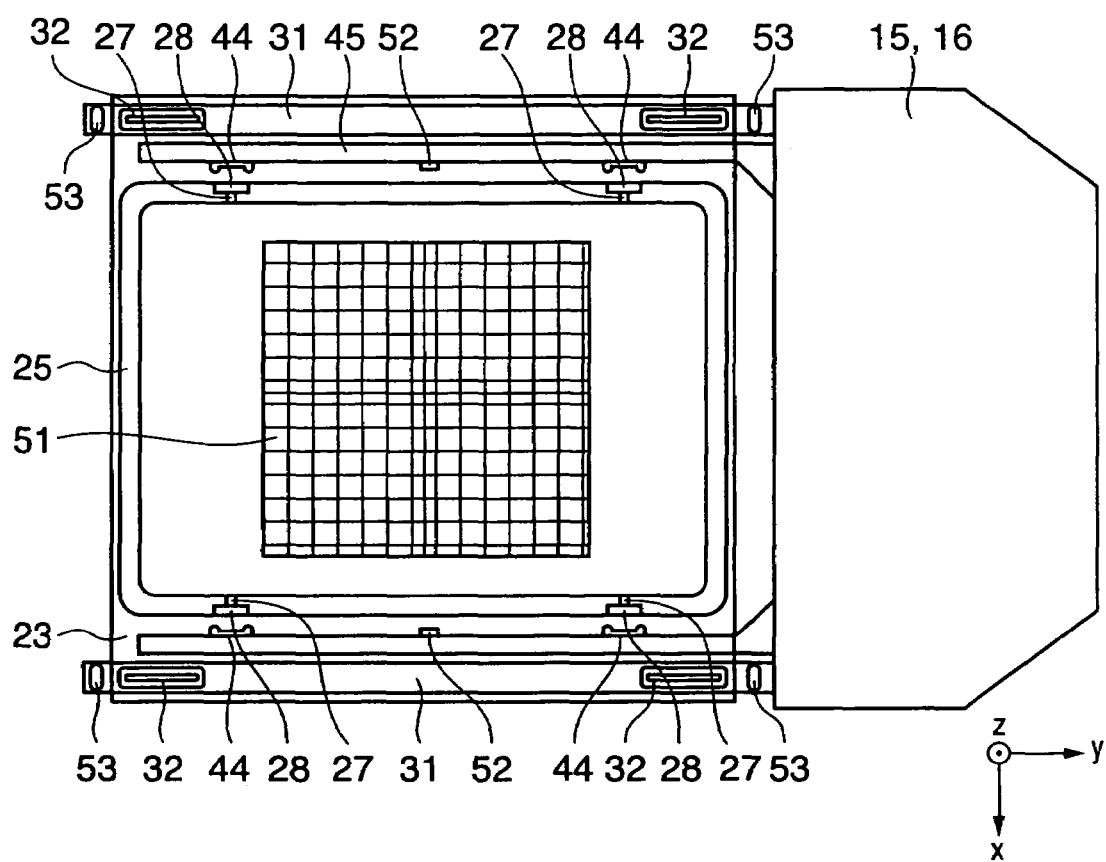
FIG. 12 is a view showing the arrangement of the reticle hand according to the fourth embodiment of the present invention.

FIGS. 11 to 14 are views showing a reticle hand according to the fourth embodiment of the present invention. FIG. 11 is a sectional view taken along the Y-axis; FIG. 12, a plan view; and FIGS. 13 and 14, bottom views. The reticle hand of this embodiment has closing mechanisms which close vent holes 27 formed in a pellicle support frame 25.

In this embodiment, each vent hole 27 is closed by a closing member 44 and an O-ring 46 which is attached to the closing member 44. Typically, the vent holes 27 are closed immediately after a reticle 30 with a pellicle is held by a reticle hand 15 (16). In this state, the reticle 30 with the pellicle is transported to a target transport position by the reticle hand 15 (16).

The closing mechanisms which close the vent holes 27 will be described below. The closing members 44 are attached to a pair of arms 45. The pair of arms 45 are supported by guides 56, respectively. Each guide 56 is attached to an air cylinder 54 through an elastic member 55. By decreasing the pressures in the air cylinders (driving devices) 54 through a pipe system (not shown), the pair of arms 45 move in the inner direction of the reticle hand 15 or 16 along the guides 56 so as to sandwich the pellicle support frame 25. With this operation, the closing members 44 close the vent holes 27.

The pellicle support frame 25 is attached to a reticle 23 with an adhesive and is so designed as to maintain the flatness of a pellicle 26. The pellicle support frame 25 is not designed to be clamped. For this reason, when a heavy load is imposed on the pellicle support frame 25 or pellicle 26, the pellicle surface may deflect, which is not preferable. Under the circumstances, in this embodiment, the elastic members 55 suppress a force with which the closing members 44 are pressed against the pellicle support frame 25 in closing the vent holes 27 so as to fall within an adequate range.

Assume that in this embodiment, the reticle with the pellicle, in which the oxygen concentration and moisture concentration are kept sufficiently low, is to be transported through the reticle transport area (transport space), whose oxygen concentration and moisture concentration are not sufficiently low. In this case, when the reticle with the pellicle is transported with its vent holes closed, the transport can be performed while keeping a good environment in the pellicle space.

[Fifth Embodiment]

Differences between the fifth embodiment of the present invention and the first embodiment will be described below. All matters except those to be mentioned here are subject to the first embodiment.

Figure 15:
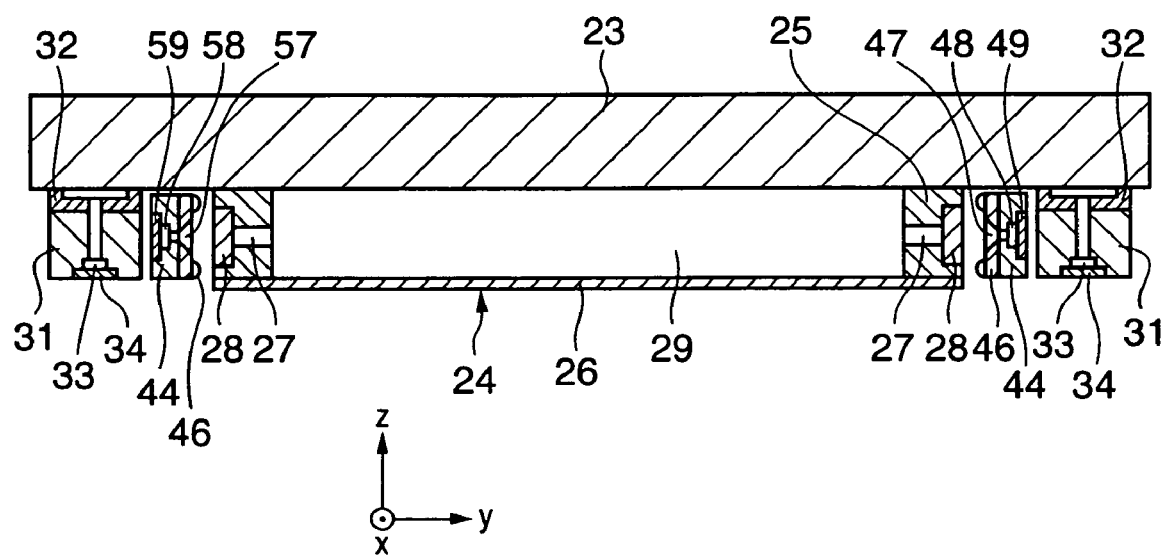
FIG. 15 is a view showing the arrangement of a reticle hand according to the fifth embodiment of the present invention.

FIG. 15 is a view showing a reticle hand according to the fifth embodiment of the present invention. The reticle hand of this embodiment has a closing mechanism which closes vent holes 27 in a pellicle structure 24 and a gas supply mechanism which supplies inert gas into a pellicle space 29.

Figure 13:
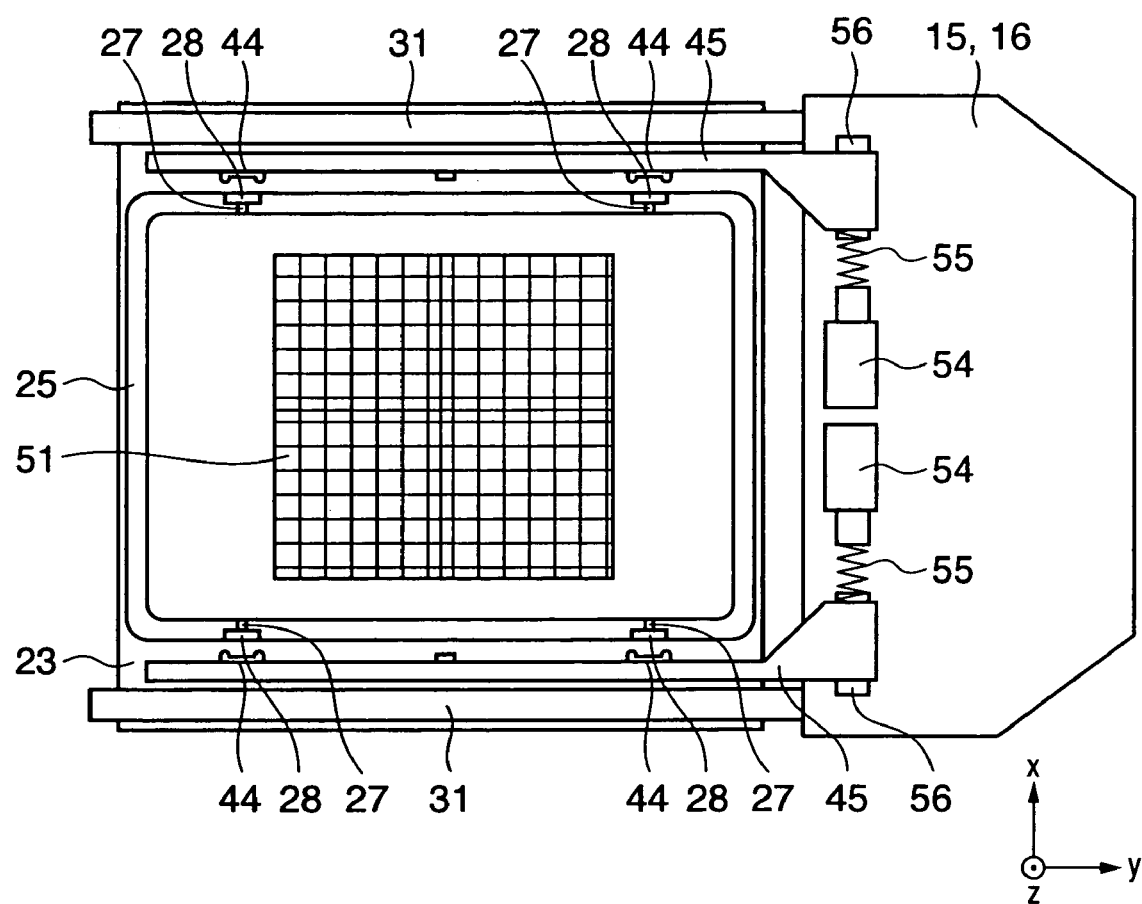
FIG. 13 is a view showing the arrangement of the reticle hand according to the fourth embodiment of the present invention.
Figure 14:
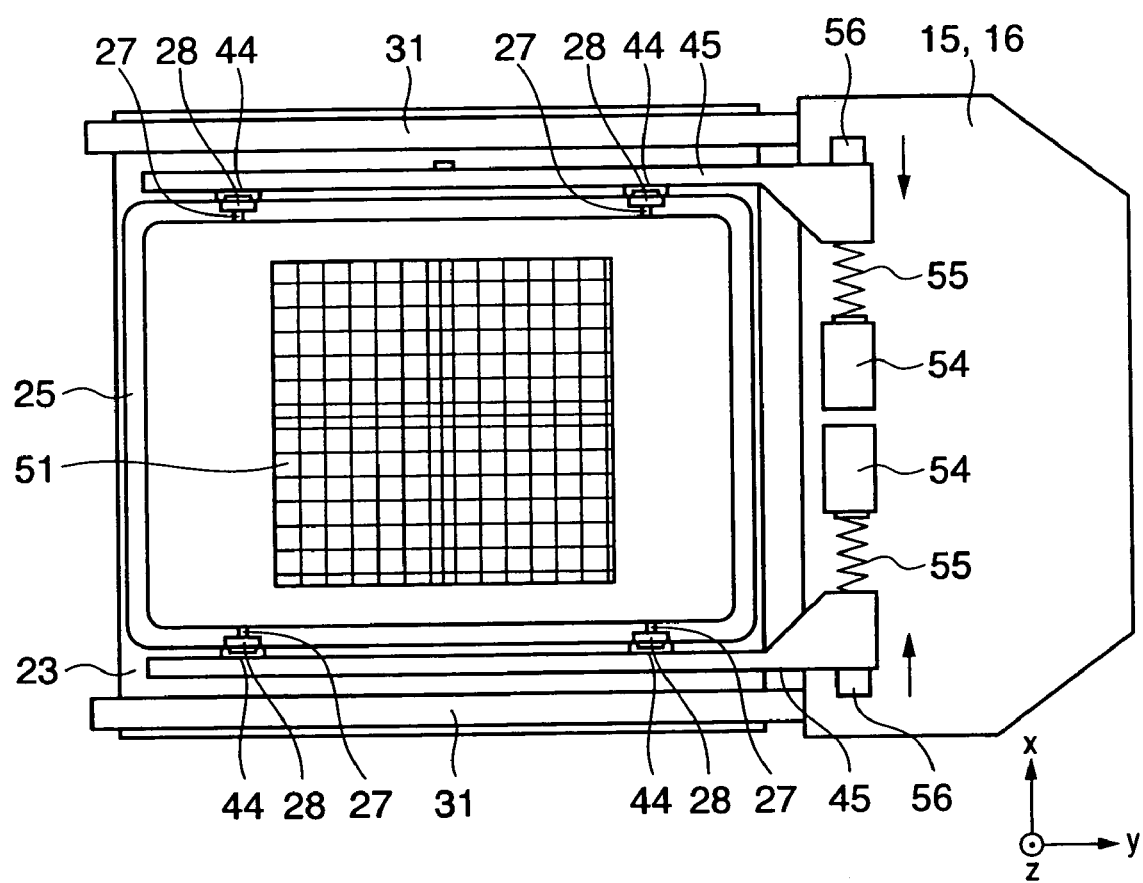
FIG. 14 is a view showing the arrangement of the reticle hand according to the fourth embodiment of the present invention.

The reticle hand of this embodiment further has a pair of arms 45 and a mechanism (54, 55, and 56) serving as a mechanism which drives the arm 45, as shown in FIGS. 13 and 14.

One of the pair of arms 45 comprises injectors 47 which inject inert gas and a gas supply path 48 for supplying inert gas to the injectors 47. In this embodiment, the gas supply path 48 includes a groove formed in the arm 45 and is formed by covering the groove with a seal member 49. With this arrangement, inert gas can be supplied into the pellicle space 29 while closing the vent holes 27 in a pellicle support frame 25 by closing members 44 formed in the arm 45.

The other arm 45 comprises sucking sections 57 which suck gas from the pellicle space 29 through the vent holes 27 and a suction path 58 which communicates with the sucking sections 57. In this embodiment, the suction path 58 includes a groove formed in the other arm 45 and is formed by covering the groove with a seal member 59. With this arrangement, gas can be sucked from the pellicle space 29 while closing the vent holes 27 in the pellicle support frame 25 by the closing members 44 formed on the other arm 45. For this reason, the pellicle space 29 can efficiently be purged without sucking the external gas of the pellicle space 29.

With the above-mentioned arrangement, the flow rate of inert gas is preferably precisely controlled on the supply side and sucking side of inert gas such that the deflection of a pellicle 26 falls within an allowable range. This is because excessive deflection of the pellicle 26 can destroy or deteriorate the pellicle 26. Under the circumstances, the flow rate control is preferably performed by providing flowmeters on the supply and sucking sides of inert gas, respectively, and monitoring the flow rates on both the sides. Alternatively, a sensor which detects expansion or deformation of the pellicle may be provided to control the flow rates on the supply and sucking sides such that the expansion or deformation of the pellicle falls within a predetermined range. Alternatively, the expansion amount of the pellicle may be suppressed by the following operation. More specifically, the flow rates on the supply and sucking sides are set at a positive pressure of about 1 to 100 Pa with respect to the outside, at least one vent hole not contributing to supply or sucking of inert gas is provided, and inert gas is exhausted from this vent hole in accordance with the difference in atmospheric pressure inside and outside the pellicle space.

Preferably, the supply and sucking of inert gas are started after docking the injectors 47 and sucking sections 57 of inert gas in the vent holes 27, and are stopped before they are separated from the vent holes 27. However, a sensor which measures the oxygen concentration in the pellicle space may be provided to stop the supply and sucking of inert gas when the oxygen concentration in the pellicle space becomes a predetermined concentration.

As has been described above, according to the preferred embodiments of the present invention, the pellicle space of a reticle with a pellicle loaded into the apparatus can be purged with inert gas in a transport system path in an exposure apparatus (device manufacturing apparatus) which uses ultraviolet light such as a fluorine excimer laser as a light source. Also, even if the oxygen concentration and/or moisture concentration in a reticle transport area is set relatively high, time-efficient gas purge can be performed without deteriorating the oxygen concentration and moisture concentration in the pellicle space. This enables high-precision and stable exposure control without any decrease in productivity of the exposure apparatus, and a fine circuit pattern can be projected stably and satisfactorily.

According to the preferred embodiments of the present invention, the oxygen concentration and moisture concentration in the reticle transport area can be set high to some extent, thereby contributing to a decrease in running cost of the apparatus.

An exposure apparatus (device manufacturing apparatus) according to the present invention is useful in a lithography process in the manufacture of various devices such as a semiconductor device and the like. The lithography process can include a step of transferring a pattern onto a substrate coated with a photosensitive agent by the exposure apparatus, a step of developing the substrate, and a step of processing (e.g., etching) an underlying layer using the pattern formed by the development as a mask. According to the exposure apparatus of the present invention, the pellicle space of a master with a pellicle can swiftly be shifted to an adequate environment (an environment whose oxygen concentration and/or moisture concentration is sufficiently low) or the adequately set environment in the pellicle space can be maintained in transporting a reticle with a pellicle. For this reason, preparations for exposure can be made in a short period, thereby shortening the total time required for the lithography process.

According to the present invention, for example, gas purge in a pellicle space can efficiently be performed or the environment in the pellicle space can efficiently be maintained in transporting a mask with a pellicle.

As many apparently widely different embodiments of the present invention can be made without departing from the spirit and scope thereof, it is to be understood that the invention is not limited to the specific embodiments thereof except as defined in the claims.

What is claimed is:

1. A transport apparatus which transports a mask with a pellicle having a vent hole which brings an external space and a pellicle space between the pellicle and the mask into communication with each other while holding the mask with the pellicle by a transport hand, said apparatus comprising:
   a closing mechanism which closes the vent hole while holding the mask with the pellicle by said transport hand.

2. A device manufacturing apparatus comprising:
   a transport apparatus as defined in claim 1; and
   an exposure section which transfers a pattern onto a substrate using a mask with a pellicle which is transported by the transport apparatus.

3. A transport method of transporting a mask with a pellicle having a vent hole which brings an external space and a pellicle space between the pellicle and the mask into communication with each other, said method comprising:
   a step of transporting the mask with the pellicle while purging the pellicle space with an inert gas using the vent hole.

4. A transport method of transporting a mask with a pellicle having a first vent hole and a second vent hole which bring an external space and a pellicle space between the pellicle and the mask into communication with each other, said method comprising:

a step of supplying an inert gas into the pellicle space through the first vent hole, and transporting the mask with the pellicle while sucking the inert gas from the pellicle space through the second vent hole.

5. A transport method of transporting a mask with a pellicle having a vent hole which brings an external space and a pellicle space between the pellicle and the mask into communication with each other, said method comprising:

a step of closing the vent hole; and a step of transporting the mask with the pellicle while closing the vent hole.

6. A device manufacturing method comprising:

a step of transferring a pattern onto a substrate coated with a photosensitive agent using a device manufacturing apparatus as defined in claim 2; and a step of developing the substrate.

\* \* \* \* \*

UNITED STATES PATENT AND TRADEMARK OFFICE
CERTIFICATE OF CORRECTION

PATENT NO.        : 6,994,507 B2  
APPLICATION NO. : 10/718678  
DATED             : February 7, 2006  
INVENTOR(S)       : Ken Matsumoto It is certified that error appears in the above-identified patent and that said Letters Patent is hereby corrected as shown below:

ON THE TITLE PAGE:
In item "(56) References Cited," under "FOREIGN PATENT DOCUMENTS," the first-listed document "JP      5-114540     5/1993" should be deleted.

COLUMN 1:
Line 49, "a" should be deleted.

Signed and Sealed this

Fifteenth Day of August, 2006

JON W. DUDAS  
*Director of the United States Patent and Trademark Office*